US012620641B2

(12) United States Patent
Yoon et al.

(10) Patent No.: US 12,620,641 B2
(45) Date of Patent: May 5, 2026

(54) BATTERY MANAGEMENT APPARATUS AND METHOD

(71) Applicant: LG ENERGY SOLUTION, LTD., Seoul (KR)

(72) Inventors: Du-Seong Yoon, Daejeon (KR); Dong-Wook Koh, Daejeon (KR); Jin-Hyung Lim, Daejeon (KR); Gwang-Hoon Jun, Daejeon (KR); Jeong-Mi Choi, Daejeon (KR); Yoon-Jung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 711 days.

(21) Appl. No.: 18/013,159

(22) PCT Filed: Jun. 23, 2021

(86) PCT No.: PCT/KR2021/007913
§ 371 (c)(1),
(2) Date: Dec. 27, 2022

(87) PCT Pub. No.: WO2022/050540
PCT Pub. Date: Mar. 10, 2022

(65) Prior Publication Data
US 2023/0318057 A1      Oct. 5, 2023

(30) Foreign Application Priority Data
Sep. 4, 2020      (KR) ........................ 10-2020-0113290

(51) Int. Cl.
H01M 10/48          (2006.01)
G01R 31/36          (2020.01)
(Continued)

(52) U.S. Cl.
CPC ........ H01M 10/48 (2013.01); G01R 31/3648 (2013.01); G01R 31/388 (2019.01); G01R 31/392 (2019.01); H01M 2010/4271 (2013.01)

(58) Field of Classification Search
USPC ........................................................ 320/132
See application file for complete search history.

(56) References Cited

U.S. PATENT DOCUMENTS

2013/0317771 A1      11/2013  Laskowsky et al.
2016/0223617 A1       8/2016  Tao et al.
(Continued)

FOREIGN PATENT DOCUMENTS

CN          106127793 A      11/2016
EP            3644079 A1       4/2020
(Continued)

OTHER PUBLICATIONS

International Search Report (with partial translation) and Written Opinion dated Oct. 22, 2021, for corresponding International Patent Application No. PCT/KR2021/007913.
(Continued)

*Primary Examiner* — Bryce M Aisaka
(74) *Attorney, Agent, or Firm* — Morgan, Lewis & Bockius LLP

(57) ABSTRACT

A battery management apparatus includes: a measuring unit to measure voltage and capacity of a battery cell; a profile generating unit to generate a battery profile representing a correspondence between the voltage and the capacity measured by the measuring unit and generate a positive electrode profile of the battery cell based on the generated battery profile and a reference negative electrode profile and a reference negative electrode differential profile preset for the battery cell; and a control unit configured to receive the generated positive electrode profile from the profile gener-
(Continued)

ating unit, derive a conversion function representing conversion information from the reference positive electrode profile to the generated positive electrode profile, generate a positive electrode prediction profile for the battery cell from the reference positive electrode profile based on the derived conversion function, and generate a battery prediction profile for the battery cell based on the generated positive electrode prediction profile.

13 Claims, 10 Drawing Sheets

(51) Int. Cl.
 *G01R 31/388* (2019.01)
 *G01R 31/392* (2019.01)
 *H01M 10/42* (2006.01)

(56) References Cited

U.S. PATENT DOCUMENTS

| | | |
|---|---|---|
| 2017/0030974 A1 | 2/2017 | Becker et al. |
| 2017/0033572 A1 | 2/2017 | Becker et al. |
| 2017/0082694 A1 | 3/2017 | Yonemoto et al. |
| 2017/0146610 A1 | 5/2017 | Cha et al. |
| 2019/0079136 A1 | 3/2019 | Lim et al. |
| 2020/0018799 A1 | 1/2020 | Lim et al. |
| 2020/0150183 A1 | 5/2020 | Yoon et al. |
| 2021/0156923 A1 | 5/2021 | Nam et al. |
| 2021/0167432 A1 | 6/2021 | Han et al. |
| 2023/0333165 A1* | 10/2023 | Takegami ............ G01R 31/392 |

FOREIGN PATENT DOCUMENTS

| | | |
|---|---|---|
| JP | 2015-219980 A | 12/2015 |
| JP | 2018-524602 A | 8/2018 |
| JP | 6372490 B2 | 8/2018 |
| JP | 2019-32274 A | 2/2019 |
| JP | 6532374 B2 | 6/2019 |
| KR | 10-1504804 B1 | 3/2015 |
| KR | 10-2016-0048585 A | 5/2016 |
| KR | 10-1972521 B1 | 4/2019 |
| KR | 10-2020-0018308 A | 2/2020 |
| KR | 10-2020-0102923 A | 9/2020 |
| WO | 2018/038383 A1 | 3/2018 |

OTHER PUBLICATIONS

Extended European Search Report issued Oct. 24, 2023 for counterpart European Patent Application No. 21864503.4.

* cited by examiner

START

S100 — MEASURING STEP

S200 — BATTERY PROFILE GENERATING STEP

S300 — POSITIVE ELECTRODE PROFILE GENERATING STEP

S400 — CONVERSION FUNCTION DERIVING STEP

S500 — POSITIVE ELECTRODE PREDICTION PROFILE GENERATING STEP

S600 — BATTERY PREDICTION PROFILE GENERATING STEP

END

BATTERY MANAGEMENT APPARATUS AND METHOD

TECHNICAL FIELD

The present application claims priority to Korean Patent Application No. 10-2020-0113290 filed on Sep. 4, 2020 in the Republic of Korea, the disclosures of which are incorporated herein by reference.

The present disclosure relates to a battery management apparatus and method, and more particularly, to a battery management apparatus and method for generating a positive electrode profile and a battery profile for a battery cell in a non-destructive manner.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Since the battery cell is degraded as it is used, in order to accurately estimate the state of charge (SOC) and/or state of health (SOH) for the degraded battery cell, various profiles are required for analyzing the degree of degradation of the battery cell. For example, when a battery profile, a positive electrode profile, and a negative electrode profile for a battery cell are provided, the degree of degradation of the battery cell may be analyzed most accurately.

Conventionally, in order to obtain a positive electrode profile and a negative electrode profile of a battery cell, a positive electrode and a negative electrode are disassembled from the battery cell, the positive electrode and the negative electrode are washed, and then a positive electrode half-cell and a negative electrode half-cell are reassembled so that a positive electrode profile and a negative electrode profile are respectively obtained from the reassembled positive and negative electrode half-cells through an experimental method such as a 3-electrode system. It took a considerable amount of time to obtain a positive electrode profile and a negative electrode profile through this process, and in particular, there is a problem in that the battery cell is exposed to the risk of explosion when the battery cell is disassembled.

Therefore, it is required to develop a technology for obtaining a negative electrode profile and/or a positive electrode profile of a battery cell in a rapid and non-destructive manner. Further, in order to analyze the degree of degradation of battery cells, technology development is also required to acquire a future battery profile in a non-destructive manner.

Disclosure

Technical Problem

The present disclosure is designed to solve the problems of the related art, and therefore the present disclosure is directed to providing a battery management apparatus and method, which may obtain a positive electrode profile by suitably adjusting a preset negative electrode profile and obtain a battery profile based on the obtained positive electrode profile.

These and other objects and advantages of the present disclosure may be understood from the following detailed description and will become more fully apparent from the example embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a measuring unit configured to measure voltage and capacity of a battery cell; a profile generating unit configured to generate a battery profile representing a correspondence between the voltage and the capacity measured by the measuring unit and generate a positive electrode profile of the battery cell based on the generated battery profile and a reference negative electrode profile and a reference negative electrode differential profile preset for the battery cell; and a control unit configured to receive the generated positive electrode profile from the profile generating unit, derive a conversion function representing conversion information from the reference positive electrode profile preset for the battery cell to the generated positive electrode profile, generate a positive electrode prediction profile for the battery cell from the reference positive electrode profile based on the derived conversion function, and generate a battery prediction profile for the battery cell based on the generated positive electrode prediction profile.

The profile generating unit may be configured to convert the battery profile into a battery differential profile representing a correspondence between the capacity and a differential voltage for the capacity, adjust the reference negative electrode differential profile to correspond to the battery differential profile, adjust the reference negative electrode profile to correspond to the adjusted negative electrode differential profile, and generate the positive electrode profile based on the adjusted negative electrode profile and the battery profile.

The profile generating unit may be configured to determine a plurality of reference peaks in the battery differential profile and adjust the reference negative electrode differential profile such that a capacity of a plurality of target peaks preset in the reference negative electrode differential profile becomes identical to a capacity of a corresponding reference peak.

The profile generating unit may be configured to adjust the reference negative electrode differential profile by adjusting an offset corresponding to a minimum capacity of the reference negative electrode differential profile and a scale representing an entire capacity region of the reference negative electrode differential profile.

The profile generating unit may be configured to adjust the reference negative electrode profile to correspond to the adjusted negative electrode differential profile by applying change information of the offset and the scale for the adjusted negative electrode differential profile to the reference negative electrode profile.

The control unit may be configured to generate the battery prediction profile by calculating a difference between a voltage of the positive electrode prediction profile and a voltage of the adjusted negative electrode profile for the same capacity.

The control unit may be configured to generate the battery prediction profile by calculating a difference between a voltage of the positive electrode prediction profile and a voltage of the reference negative electrode profile for the same capacity.

The conversion function may be configured to convert a voltage per capacity of the reference positive electrode profile into a voltage per capacity of the generated positive electrode profile, for the same capacity.

When the conversion function is provided in plurality, the control unit may be configured to derive a conversion prediction function based on a voltage change amount per capacity between the plurality of conversion functions and generate the positive electrode prediction profile by applying the derived conversion prediction function to the reference positive electrode profile.

The control unit may be configured to derive the conversion prediction function for a target point and generate the positive electrode prediction profile for the target point by applying the derived conversion prediction function to the reference positive electrode profile.

The profile generating unit may be configured to generate the battery profile and generate the positive electrode profile at every preset cycle.

The control unit may be configured to derive a conversion function between each of a plurality of positive electrode profiles generated by the profile generating unit until a current cycle and the reference positive electrode profile, derive the conversion prediction function based on the plurality of derived conversion functions, generate the positive electrode prediction profile by using the derived conversion prediction function and the reference positive electrode profile until a next cycle arrives, and then generate the battery prediction profile.

A battery pack according to another aspect of the present disclosure may comprise the battery management apparatus according to an aspect of the present disclosure.

A battery management method according to still another aspect of the present disclosure may comprise: a measuring step of measuring voltage and capacity of a battery cell; a battery profile generating step of generating a battery profile representing a correspondence between the voltage and the capacity measured in the measuring step; a positive electrode profile generating step of generating a positive electrode profile of the battery cell based on the battery profile generated in the battery profile generating step and a reference negative electrode profile and a reference negative electrode differential profile preset for the battery cell; a conversion function deriving step of deriving a conversion function representing conversion information from the reference positive electrode profile preset for the battery cell to the generated positive electrode profile; a positive electrode prediction profile generating step of generating a positive electrode prediction profile for the battery cell from the reference positive electrode profile based on the conversion function derived in the conversion function deriving step; and a battery prediction profile generating step of generating a battery prediction profile for the battery cell based on the positive electrode prediction profile generated in the positive electrode prediction profile generating step.

Advantageous Effects

The battery management apparatus according to an aspect of the present disclosure may estimate a battery profile by generating a positive electrode prediction profile based on a generated battery profile and generating a battery prediction profile based on the generated positive electrode prediction profile. Due to this, the battery prediction profile may be generated even at a cycle point in which a battery profile is not directly generated based on the capacity and voltage of the battery cell. Accordingly, since a profile for analyzing the degradation of the battery cell may be secured at more various cycle points, the accuracy of the degradation analysis for the battery cell may be improved.

The effects of the present disclosure are not limited to the effects mentioned above, and other effects not mentioned will be clearly understood by those skilled in the art from the description of the claims.

BRIEF DESCRIPTION OF DRAWINGS

The accompanying drawings illustrate embodiments of the present disclosure and together with the foregoing disclosure, serve to provide further understanding of the technical features of the present disclosure, and thus, the present disclosure is not construed as being limited to the drawing.

MODES OF PRACTICE

It should be understood that the terms used in the specification and the appended claims should not be construed as limited to general and dictionary meanings, but should be interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
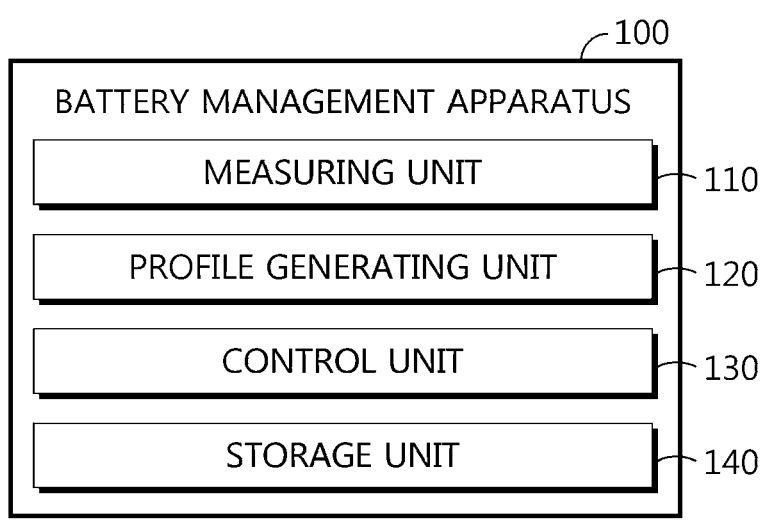
FIG. 1 is a diagram schematically showing a battery management apparatus according to an embodiment of the present disclosure.
Figure 2:
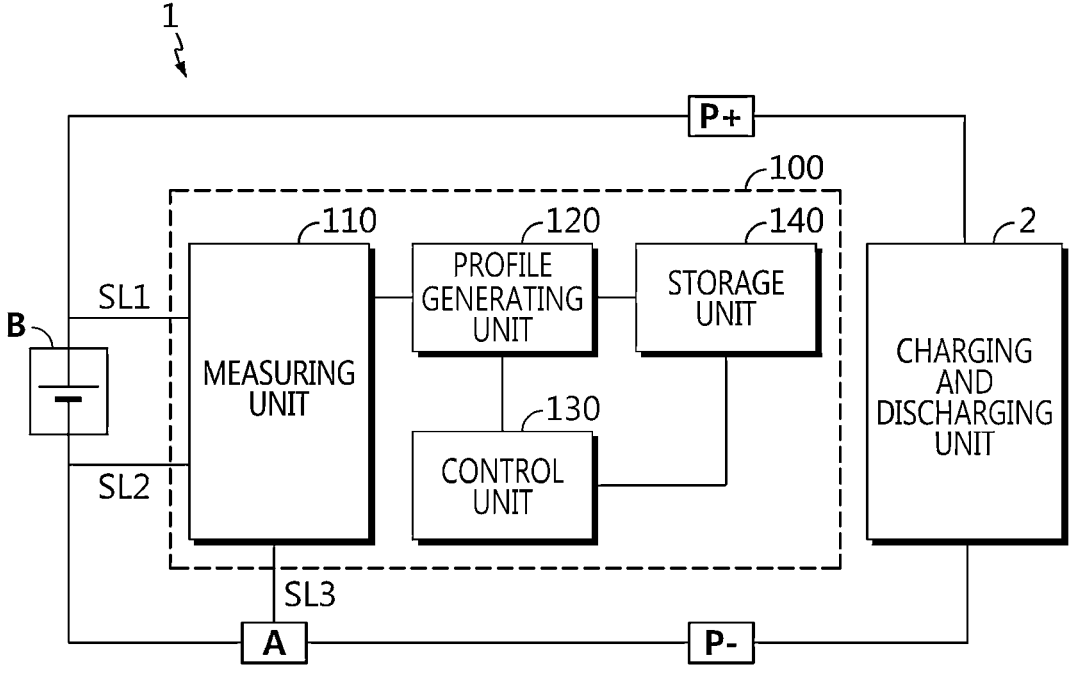
FIG. 2 is a diagram showing an example configuration of a battery pack including the battery management apparatus according to an embodiment of the present disclosure.

FIG. 1 is a diagram schematically showing a battery management apparatus 100 according to an embodiment of the present disclosure. FIG. 2 is a diagram showing an example configuration of a battery pack 1 including the battery management apparatus 100 according to an embodiment of the present disclosure.

Referring to FIGS. 1 and 2, the battery management apparatus 100 according to an embodiment of the present disclosure may include a measuring unit 110, a profile generating unit 120, and a control unit 130.

The measuring unit 110 may be configured to measure voltage and capacity of the battery cell B. Here, the unit of voltage may be [V], and the unit of capacity may be [mAh].

Here, a battery cell B means one independent cell that includes a negative electrode terminal and a positive electrode terminal and is physically separable. For example, one pouch-type lithium polymer cell may be regarded as a battery cell B.

Specifically, the measuring unit 110 may measure the voltage of the battery by measuring voltages at both ends of the battery cell B, respectively. Also, the measuring unit 110 may measure the current applied to the battery cell B and the charging time while the battery cell B is being charged. In addition, the measuring unit 110 may measure the capacity of the battery cell B based on the measured current of the battery cell B and the charging time.

For example, in the embodiment of FIG. 2, the measuring unit 110 may be connected to a first sensing line SL1, a second sensing line SL2, and a third sensing line SL3. The measuring unit 110 may measure the voltage of the battery cell B through the first sensing line SL1 and the second sensing line SL2. In addition, the measuring unit 110 may be connected to a current measuring unit A through the third sensing line SL3, and may measure the current of the battery cell B through the current measuring unit A. Preferably, the measuring unit 110 may include a timer capable of measuring the charging time while measuring the current of the battery cell B.

The profile generating unit 120 may be configured to receive the measured voltage and capacity from the measuring unit 110.

For example, in the embodiment of FIG. 2, the profile generating unit 120 may be communicatively connected to the measuring unit 110. In addition, the profile generating unit 120 may receive the voltage and capacity for the battery cell B from the measuring unit 110.

The profile generating unit 120 may be configured to generate a battery profile (Pb) representing the correspondence between the voltage and the capacity measured by the measuring unit 110.

Figure 3:
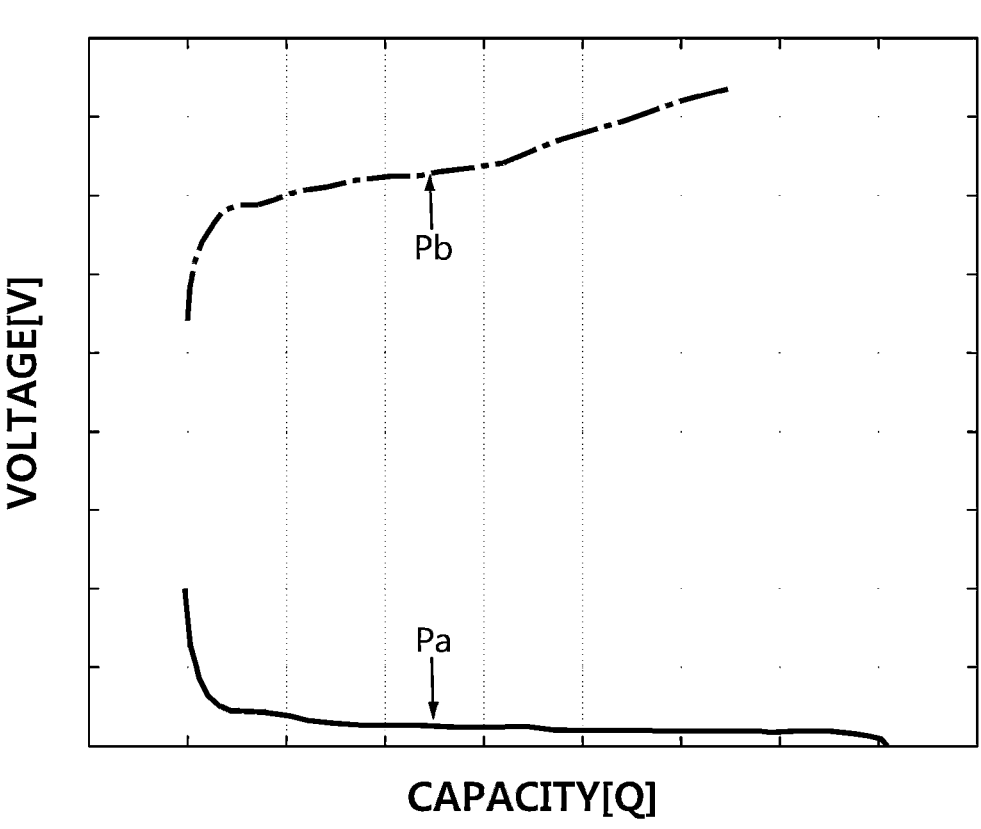
FIG. 3 is a diagram schematically showing a battery profile and a negative electrode profile according to an embodiment of the present disclosure.

FIG. 3 is a diagram schematically showing a battery profile (Pb) and a reference negative electrode profile (Pa) according to an embodiment of the present disclosure. Here, FIG. 3 is a diagram schematically showing the battery profile (Pb) and the reference negative electrode profile (Pa) in a graph form. Specifically, FIG. 3 is a diagram schematically showing an X-Y graph when a capacity is set to X and a voltage is set to Y.

Specifically, the battery profile (Pb) may be a profile configured to indicate the correspondence between the voltage and the capacity of the battery cell B measured at the same time by the measuring unit 110.

The profile generating unit 120 may be configured to generate a positive electrode profile of the battery cell B based on the generated battery profile (Pb) and a reference negative electrode profile (Pa) and a reference negative electrode differential profile (Pa_d) preset for the battery cell B.

Here, the reference negative electrode profile (Pa) may be a profile configured to indicate the correspondence between the negative electrode voltage and capacity of the battery cell B in the beginning of life (BOL) state. That is, the reference negative electrode profile (Pa) is a profile representing the correspondence between the voltage and the capacity of a negative electrode half-cell in the BOL state. The reference negative electrode profile (Pa) may be generated in advance through a charge/discharge experiment on the negative electrode half-cell.

In addition, the reference negative electrode differential profile (Pa_d) may be a differential profile of the reference negative electrode profile (Pa) with respect to capacity. Specifically, the reference negative electrode differential profile (Pa_d) may be a profile configured to indicate the correspondence between the capacity of the BOL negative electrode cell and the differential voltage. Here, the differential voltage is a differential value of voltage with respect to capacity, and may be expressed as "dV/dQ", with the unit of [V/mAh]. That is, the differential voltage may be a value representing an instantaneous rate of change of voltage with respect to capacity.

In general, the battery profile (Pb) may be expressed as a difference between the voltage of the positive electrode profile and the voltage of the negative electrode profile for the same capacity. In other words, the positive electrode profile may be expressed as the sum of the voltage of the battery profile (Pb) and the voltage of the negative electrode profile for the same capacity.

Accordingly, the profile generating unit 120 may generate a positive electrode profile from the generated battery profile (Pb) in consideration of the reference negative electrode profile (Pa) and the reference negative electrode differential profile (Pa_d). Specific details of the embodiment in which the profile generating unit 120 generates a positive electrode profile will be described later.

The control unit 130 may be configured to receive the generated positive electrode profile from the profile generating unit 120.

For example, in the embodiment of FIG. 2, the control unit 130 and the profile generating unit 120 may be communicatively connected. In addition, the control unit 130 may receive the positive electrode profile from the profile generating unit 120.

The control unit 130 may be configured to derive a conversion function representing conversion information from the reference positive electrode profile preset for the battery cell B to the generated positive electrode profile.

Here, the reference positive electrode profile (Pc) corresponds to the reference negative electrode profile (Pa), and may be a profile configured to indicate the correspondence between voltage and capacity of the positive electrode of the battery cell B in the BOL state. That is, the reference positive electrode profile (Pc) may be a profile configured to indicate the correspondence between voltage and capacity of the positive electrode half-cell in the BOL state. The reference positive electrode profile (Pc) may be generated in advance through a charge/discharge experiment on the positive electrode half-cell.

In addition, the conversion function may be configured to convert a voltage per capacity of the reference positive electrode profile (Pc) to a voltage per capacity of the generated positive electrode profile for the same capacity. That is, when the derived conversion function is applied to the reference positive electrode profile (Pc), the positive electrode profile generated by the profile generating unit 120 may be generated.

Specifically, the control unit 130 may derive a conversion function capable of converting the reference positive electrode profile (Pc) to the generated positive electrode profile by comparing voltages of the reference positive electrode profile (Pc) and the positive electrode profile generated by the profile generating unit 120 for the same capacity.

For example, it is assumed that the profile generating unit 120 generates a battery profile (Pb) and a positive electrode profile at the $100^{th}$ cycle point and the $200^{th}$ cycle point, respectively. The control unit 130 may derive a first conversion function (f1) corresponding to the $100^{th}$ cycle point by comparing the positive electrode profile generated at the $100^{th}$ cycle point with the reference positive electrode profile (Pc). In addition, the control unit 130 may derive a second conversion function (f2) corresponding to the $200^{th}$ cycle point by comparing the positive electrode profile generated at the $200^{th}$ cycle point with the reference positive electrode profile (Pc).

The control unit 130 may be configured to generate a positive electrode prediction profile (Pc_e) for the battery cell B from the reference positive electrode profile (Pc) based on the derived conversion function.

Specifically, the control unit 130 may derive a conversion prediction function (fe) by using the derived conversion function.

Here, the conversion prediction function (fe) may be a conversion function estimated by the control unit 130. That is, the conversion prediction function (fe) may be a function for generating the positive electrode prediction profile (Pc_e) for the battery cell B at a point of time when the positive electrode profile is not generated by the profile generating unit 120.

In addition, the positive electrode prediction profile (Pc_e) is a positive electrode profile estimated for the battery cell B, and it may be a prediction profile not generated by the profile generating unit 120 but estimated when the control unit 130 applies the derived conversion prediction function (fe) to the reference positive electrode profile (Pc).

For example, when a plurality of conversion functions are derived by the control unit 130, the control unit 130 may compare the plurality of conversion functions to derive the correspondence between the plurality of conversion functions. In addition, the control unit 130 may derive the conversion prediction function (fe) according to the derived correspondence. After that, the control unit 130 may generate a positive electrode prediction profile (Pc_e) by applying the derived conversion prediction function (fe) to the reference positive electrode profile (Pc).

As in the previous embodiment, it is assumed that the control unit 130 derives the first conversion function (f1) at the $100^{th}$ cycle point and the second conversion function (f2) at the $200^{th}$ cycle point. The control unit 130 may determine change information of the conversion function according to the cycle by comparing the first conversion function (f1) and the second conversion function (f2). In addition, the control unit 130 may derive conversion prediction functions (fe) for cycle points excluding the $100^{th}$ cycle point and the $200^{th}$ cycle point, based on the determined change information. Preferably, the control unit 130 may derive conversion prediction functions (fe) for time points after the $200^{th}$ cycle point.

The control unit 130 may be configured to generate a battery prediction profile (Pb_e) for the battery cell B based on the generated positive electrode prediction profile (Pc_e).

For example, it is assumed that the control unit 130 derives a conversion prediction function (fe) of the $250^{th}$ cycle point. The control unit 130 may generate a positive electrode prediction profile (Pc_e) of the $250^{th}$ cycle point by applying the derived conversion prediction function (fe) to the reference positive electrode profile (Pc). In addition, the control unit 130 may generate a battery prediction profile (Pb_e) of the $250^{th}$ cycle point based on the positive electrode prediction profile (Pc_e) of the $250^{th}$ cycle point.

The battery management apparatus 100 according to an embodiment of the present disclosure may generate a battery profile (Pb) by measuring the capacity and voltage of the battery cell B when it is intended to acquire the battery profile (Pb). However, in the case of generating the battery profile (Pb) by measuring the capacity and voltage of the battery cell B at every cycle, charging and discharging of the battery cell B must be controlled in order to obtain an accurate battery profile (Pb). Therefore, there is a problem that the use of the battery cell B is too limited. For example, in order to obtain an accurate battery profile (Pb), a low charge/discharge rate of 0.05 C-rate to 0.3 C-rate is required, which may cause excessive restrictions in the use of the battery cell B.

Therefore, the battery management apparatus 100 according to an embodiment of the present disclosure may estimate the battery profile (Pb) by generating the positive electrode prediction profile (Pc_e) based on the generated battery profile (Pb) and generating the battery prediction profile (Pb_e) based on the generated positive electrode prediction profile (Pc_e). Due to this, the battery prediction profile (Pb_e) may be generated even at a cycle point where the battery profile (Pb) is not directly generated based on the capacity and voltage of the battery cell B. Therefore, since a profile for analyzing the degradation of the battery cell B may be secured at more various cycle points, the accuracy of the degradation analysis for the battery cell B may be improved.

In addition, the battery management apparatus 100 according to an embodiment of the present disclosure may generate the positive electrode prediction profile (Pc_e) and the battery prediction profile (Pb_e) for a future time point by deriving the conversion prediction function (fe) based on the correspondence between the derived conversion functions. That is, since the battery management apparatus 100 may generate the positive electrode prediction profile (Pc_e) and the battery prediction profile (Pb_e) for a future time point, there is an advantage that various profiles may be secured to analyze the expected degradation of the battery cell B.

Meanwhile, the control unit 130 provided to the battery management apparatus 100 according to an embodiment of the present disclosure may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

In addition, referring to FIGS. 1 and 2, the battery management apparatus 100 may further include a storage unit 140. The storage unit 140 may store data necessary for operation and function of each component of the battery management apparatus 100, data generated in the process of performing the operation or function, or the like. For example, the storage unit 140 may store the program and data necessary for the profile generating unit 120 to generate the battery profile (Pb) and the positive electrode profile and for the control unit 130 to generate the positive electrode prediction profile (Pc_e) and the battery prediction profile (Pb_e).

Specifically, the storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the measuring unit 110, the profile generating unit 120 and the control unit 130 are defined.

Hereinafter, an embodiment in which the profile generating unit 120 generates a positive electrode profile will be described in more detail.

First, the profile generating unit 120 may be configured to convert the battery profile (Pb) into a battery differential profile (Pb_d) representing the correspondence between the capacity and a differential voltage for the capacity.

Specifically, the profile generating unit 120 may convert the battery profile (Pb) representing the correspondence between the capacity and voltage of the battery cell B into the battery differential profile (Pb_d) representing the correspondence between the capacity of the battery cell B and the differential voltage.

Figure 4:
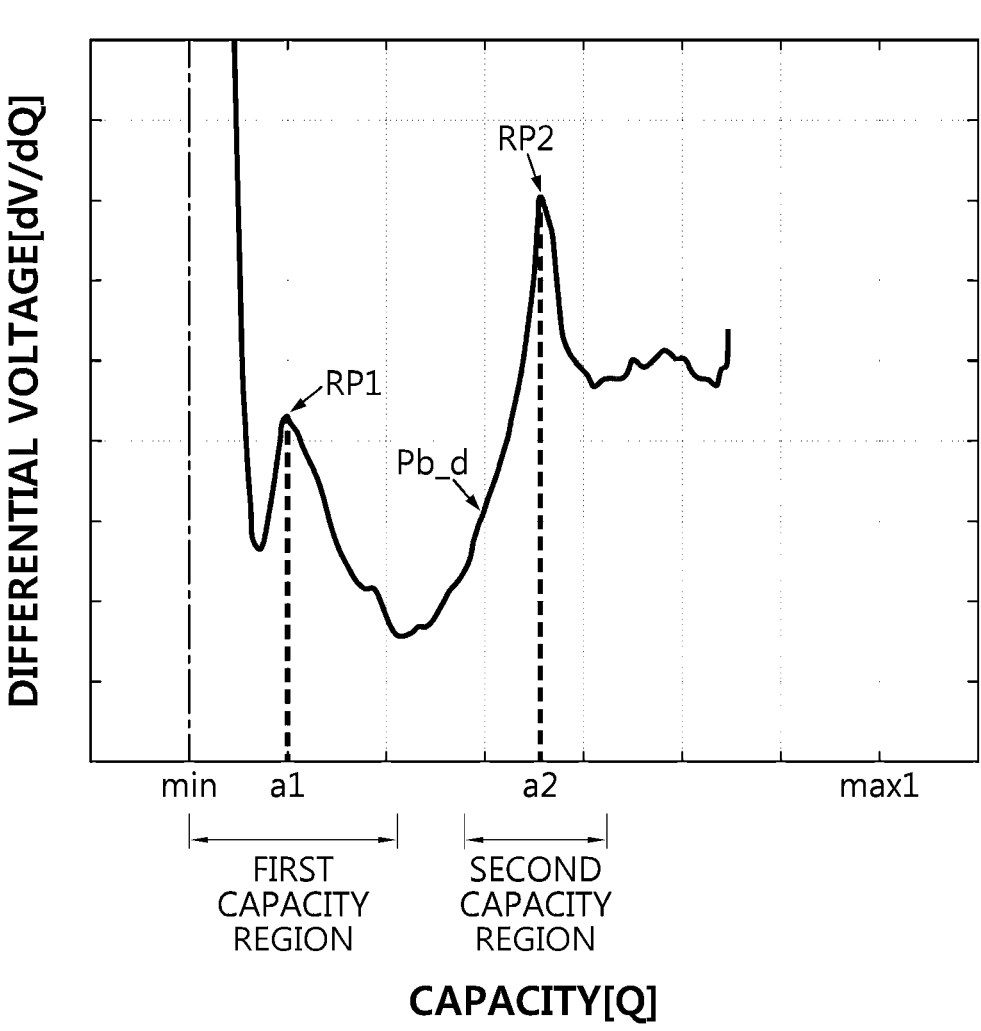
FIG. 4 is a diagram schematically showing a battery differential profile according to an embodiment of the present disclosure.

FIG. 4 is a diagram schematically showing the battery differential profile (Pb_d) according to an embodiment of the present disclosure. Here, FIG. 4 is a diagram showing the battery differential profile (Pb_d) in a graph form. Specifically, FIG. 4 is a diagram schematically showing an X-Y graph when the capacity of the battery cell B is set to the X axis and the differential voltage is set to the Y axis.

Next, the profile generating unit 120 may be configured to adjust the reference negative electrode differential profile (Pa_d) to correspond to the battery differential profile (Pb_d).

Figure 5:
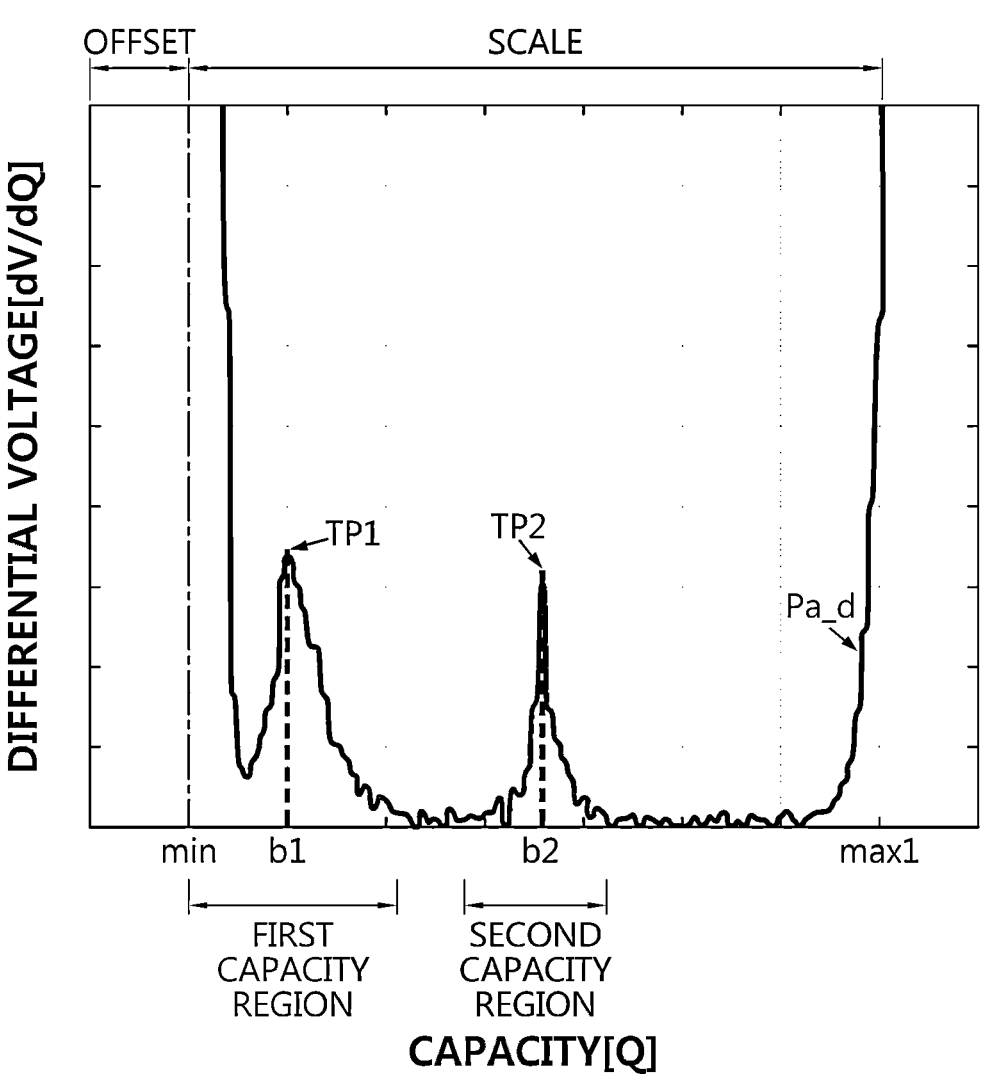
FIG. 5 is a diagram schematically showing a negative electrode differential profile according to an embodiment of the present disclosure.

FIG. 5 is a diagram schematically showing the negative electrode differential profile (Pa_d) according to an embodiment of the present disclosure. Here, FIG. 5 is a diagram showing the reference negative electrode differential profile (Pa_d) in a graph form. Specifically, FIG. 5 is a diagram schematically showing an X-Y graph when the capacity of the negative electrode half-cell is set to the X axis and the differential voltage is set to the Y axis.

Specifically, the profile generating unit 120 may be configured to determine a plurality of reference peaks in the battery differential profile (Pb_d).

The reference peak may be a peak of which the instantaneous rate of change of the differential voltage with respect to capacity is 0 and the differential voltage is largest in the corresponding capacity region. For example, in the embodiment of FIG. 4, the profile generating unit 120 may determine a peak of which the instantaneous rate of change of the differential voltage with respect to capacity in the first capacity region is 0 and the differential voltage is largest as the first reference peak (RP1). In addition, the profile generating unit 120 may determine a peak of which the instantaneous rate of change of the differential voltage with respect to capacity in the second capacity region is 0 and the differential voltage is largest as the second reference peak (RP2).

Also, the first capacity region and the second capacity region may be preset not to overlap each other. In addition, the information on the first capacity region and the second capacity region may be stored in advance in the profile generating unit 120 and/or the storage unit 140.

Specifically, the first capacity region and the second capacity region may be capacity regions configured in consideration of the electrochemical characteristics of the battery cell B. For example, in the battery differential profile (Pb_d), a predetermined capacity region in which the first reference peak (RP1) may appear may be preset as the first capacity region, and a predetermined capacity region in which the second reference peak (RP2) may appear may be preset as the second capacity region. A more specific embodiment of the first capacity region and the second capacity region will be described later.

For example, referring to FIGS. 4 and 5, the first capacity region may be set as a capacity region of 0% to 30% in the entire capacity region (min to max1 region) of the negative electrode half-cell of the BOL battery cell B. The first capacity region may be preset as a region of "min" to "min+{(max1−min)×0.3}". In addition, the second capacity region may be set as a capacity region of 40% to 60% in the entire capacity region (min to max1 region) of the negative electrode half-cell of the BOL battery cell B. The second capacity region may be preset as "min+{(max1−min)×0.4}" to "min+{(max1−min)×0.6}" region.

The profile generating unit 120 may be configured to adjust the reference negative electrode differential profile (Pa_d) such that a capacity of a plurality of target peaks preset in the reference negative electrode differential profile (Pa_d) becomes equal to a capacity of a corresponding reference peak.

Figure 6:
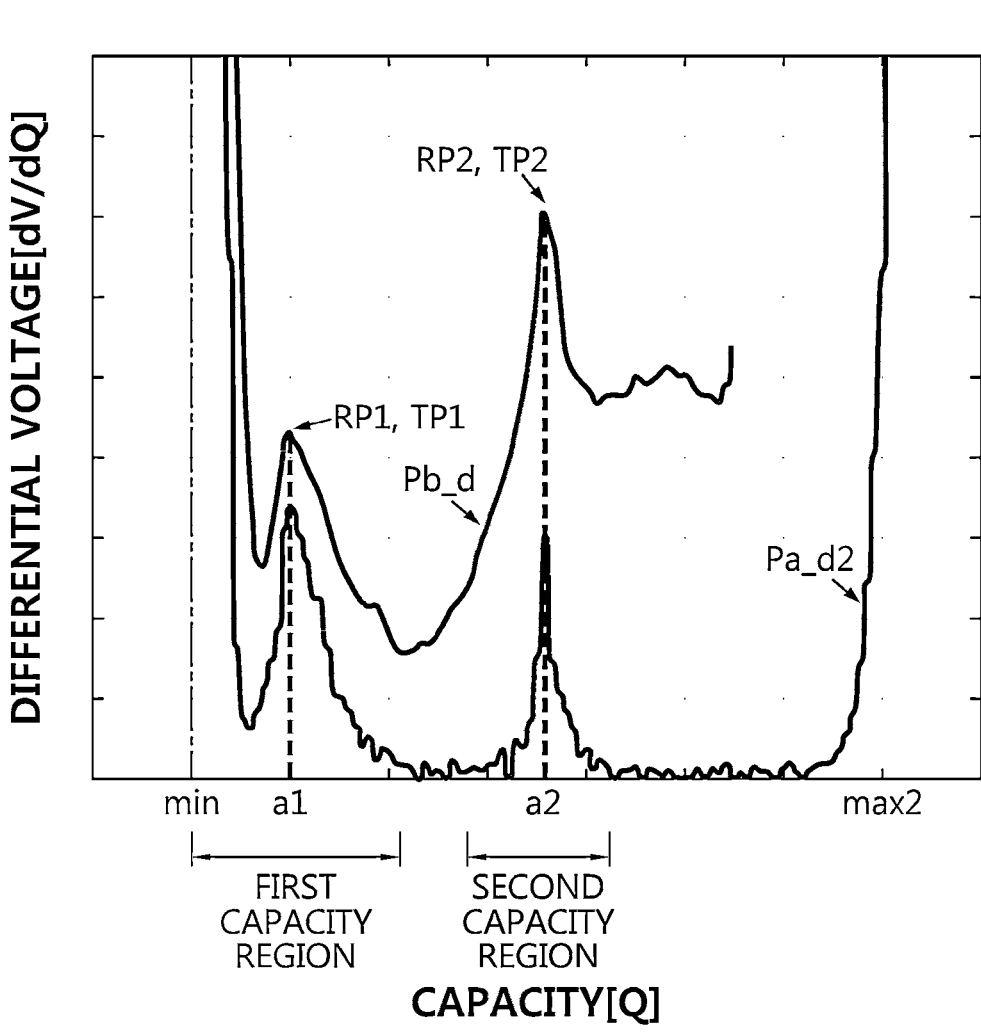
FIG. 6 is a diagram schematically showing a negative electrode differential profile adjusted by the battery management apparatus according to an embodiment of the present disclosure.

FIG. 6 is a diagram schematically showing a negative electrode differential profile (Pa_d2) adjusted by the battery management apparatus 100 according to an embodiment of the present disclosure.

Specifically, the profile generating unit 120 may be configured to adjust the reference negative electrode differential profile (Pa_d) by adjusting the offset corresponding to the minimum capacity of the reference negative electrode differential profile (Pa_d) and the scale representing the entire capacity region of the reference negative electrode differential profile (Pa_d).

Referring to FIG. 5, the offset may correspond to the minimum capacity among the entire capacity region of the reference negative electrode differential profile (Pa_d), and the scale may correspond to the entire capacity region of the reference negative electrode differential profile (Pa_d).

That is, the profile generating unit 120 may adjust the offset and/or the scale of the reference negative electrode differential profile (Pa_d) so that the capacity of the plurality of target peaks included in the reference negative electrode differential profile (Pa_d) becomes equal to the capacity of the corresponding reference peak.

For example, referring to FIG. 4, the capacity of the first reference peak (RP1) included in the battery differential profile (Pb_d) may be a1 [mAh], and the capacity of the second reference peak (RP2) may be a2 [mAh]. In addition, referring to FIG. 5, the capacity of the first target peak (TP1) included in the reference negative electrode differential profile (Pa_d) may be b1 [mAh], and the capacity of the second target peak (TP2) may be b2 [mAh]. As in the embodiment of FIG. 6, the profile generating unit 120 may adjust the offset and/or the scale of the reference negative electrode differential profile (Pa_d) such that the capacity of the first target peak (TP1) becomes a1 [mAh] and the capacity of the second target peak (TP2) becomes a2 [mAh].

For example, since the minimum capacity and/or the size of the entire capacity region may vary in the negative electrode profile of the battery cell B in the BOL state, the shape of the negative electrode profile may be maintained even if the battery cell B is degraded. That is, even if the battery cell B is degraded, the scale of the entire capacity region of the negative electrode profile is changed as a whole without changing only the scale of some capacity region of the entire capacity region of the negative electrode profile. Thus, even if the battery cell B is degraded, the shape of the negative electrode profile may be maintained. Accordingly, the profile generating unit 120 may obtain the adjusted negative electrode differential profile (Pa_d2) corresponding to the battery differential profile (Pb_d) by adjusting the offset and/or the scale of the reference negative electrode differential profile (Pa_d).

Next, the profile generating unit 120 may be configured to adjust the reference negative electrode profile (Pa) to correspond to the adjusted negative electrode differential profile (Pa_d2).

Specifically, the profile generating unit 120 may be configured to adjust the reference negative electrode profile (Pa) to correspond to the adjusted negative electrode differential profile (Pa_d2) by applying the change information of the offset and the scale for the adjusted negative electrode differential profile (Pa_d2) to the reference negative electrode profile (Pa).

Figure 7:
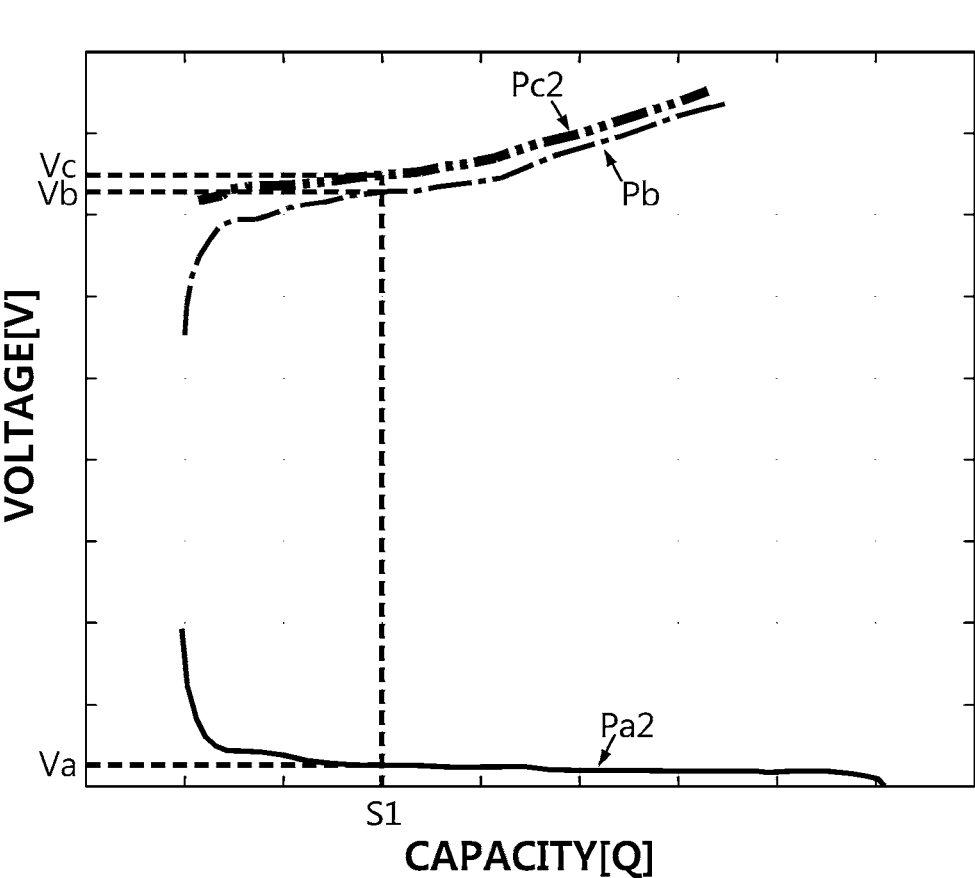
FIG. 7 is a diagram schematically showing an example where a positive electrode profile is generated by the battery management apparatus according to an embodiment of the present disclosure.

FIG. 7 is a diagram schematically showing an example where a positive electrode profile (Pc2) is generated by the battery management apparatus 100 according to an embodiment of the present disclosure.

Referring to FIGS. 3, 6 and 7, the profile generating unit 120 may generate an adjusted negative electrode profile (Pa2) by applying the offset and the scale of the adjusted negative electrode differential profile (Pa_d2) to the reference negative electrode profile (Pa).

Finally, the profile generating unit 120 may be configured to generate the positive electrode profile (Pc2) based on the adjusted negative electrode profile (Pa2) and the battery profile (Pb).

Specifically, the profile generating unit 120 may generate the positive electrode profile (Pc2) by summing the voltage per capacity of the battery profile (Pb) and the voltage per capacity of the adjusted negative electrode profile (Pa2) for the same capacity.

For example, in the embodiment of FIG. 7, looking at 51 [mAh] capacity, the voltage corresponding to the 51 [mAh] capacity in the adjusted negative electrode profile (Pa2) may be Va [V], and the voltage corresponding to the 51 [mAh] capacity in the battery profile (Pb) may be Vb [V]. The profile generating unit 120 may obtain Vc [V] by calculating "Va+Vb". In addition, the profile generating unit 120 may generate the positive electrode profile (Pc2) in which the voltage corresponding to the 51 [mAh] capacity is Vc [V].

Hereinafter, more specific embodiments of the first capacity region and the second capacity region will be described in consideration of the characteristics of the battery cell B.

Specifically, in the embodiment of FIG. 5, the first target peak (TP1) and the second target peak (TP2) included in the negative electrode differential profile (Pa_d) may be related to the staging phenomenon in which lithium ions are extracted during the discharge process.

In general, when the battery cell B is discharged, a staging process in which lithium ions contained between graphite layers are extracted is performed. The staging process in the discharge process proceeds from a high stage to a low stage according to the extraction reaction of lithium ions. For example, in the discharge process, the staging process is performed in the order of stage IV, stage III, stage II, and stage I.

For example, in the embodiment of FIG. 5, the capacity (b1) of the first target peak (TP1) included in the reference negative electrode differential profile (Pa_d) may correspond to the negative electrode capacity when the stage III state progresses. Specifically, the capacity (b1) of the first target peak (TP1) may correspond to the negative electrode capacity when the stage II and stage III states that are coexisting are converted to the stage III state.

In addition, in the embodiment of FIG. 5, the capacity (b2) of the second target peak (TP2) included in the reference negative electrode differential profile (Pa_d) may correspond to the negative electrode capacity when the stage II state progresses. Specifically, the capacity (b2) of the second target peak (TP2) may correspond to the negative electrode capacity when the stage I and stage II states that are coexisting are converted to the stage II state.

In addition, due to the characteristics of the battery cell B, the capacity corresponding to the first target peak (TP1) and the second target peak (TP2) may not change significantly even if the battery cell B is degraded. In addition, depending on the degree of degradation of the battery cell B, the capacity of each of the first reference peak (RP1) and the second reference peak (RP2) may be identical or similar to the capacity of the first target peak (TP1) and the second target peak (TP2).

Accordingly, the first capacity region is a capacity region in which the first reference peak (RP1) is expected to appear, and may be set as a region in which the capacity of the first target peak (TP1) is considered. Similarly, the second capacity region is a capacity region in which the second reference peak (RP2) is expected to appear, and may be set as a region in which the capacity of the second target peak (TP2) is considered.

For example, in the embodiment of FIGS. 4, 5 and 6, the first capacity region may be set as a capacity region of 0% to 30% in the entire capacity region (min to max1 region) of the negative electrode half-cell of the BOL battery cell B. In addition, the second capacity region may be set as a capacity region of 40% to 60% in the entire capacity region (min to max1 region) of the negative electrode half-cell of the BOL battery cell B.

Hereinafter, an embodiment in which the control unit 130 generates the battery prediction profile (Pb_e) will be described in more detail.

First, when the conversion function is provided in plurality, the control unit 130 may be configured to derive a conversion prediction function (fe) based on a voltage change amount per capacity between the plurality of conversion functions (f1, f2).

Preferably, in order for the control unit 130 to derive the conversion prediction function (fe), at least two conversion functions may be required.

Figure 8:
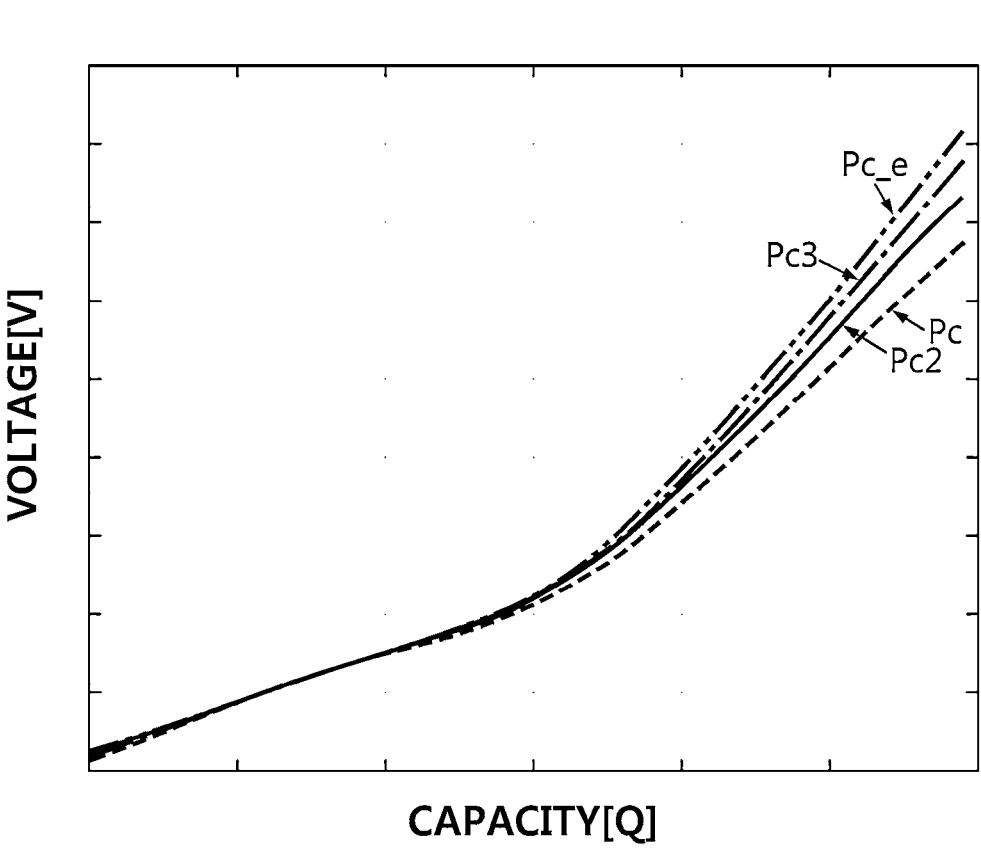
FIG. 8 is a diagram schematically showing an example where a positive electrode prediction profile is generated by the battery management apparatus according to an embodiment of the present disclosure.
Figure 9:
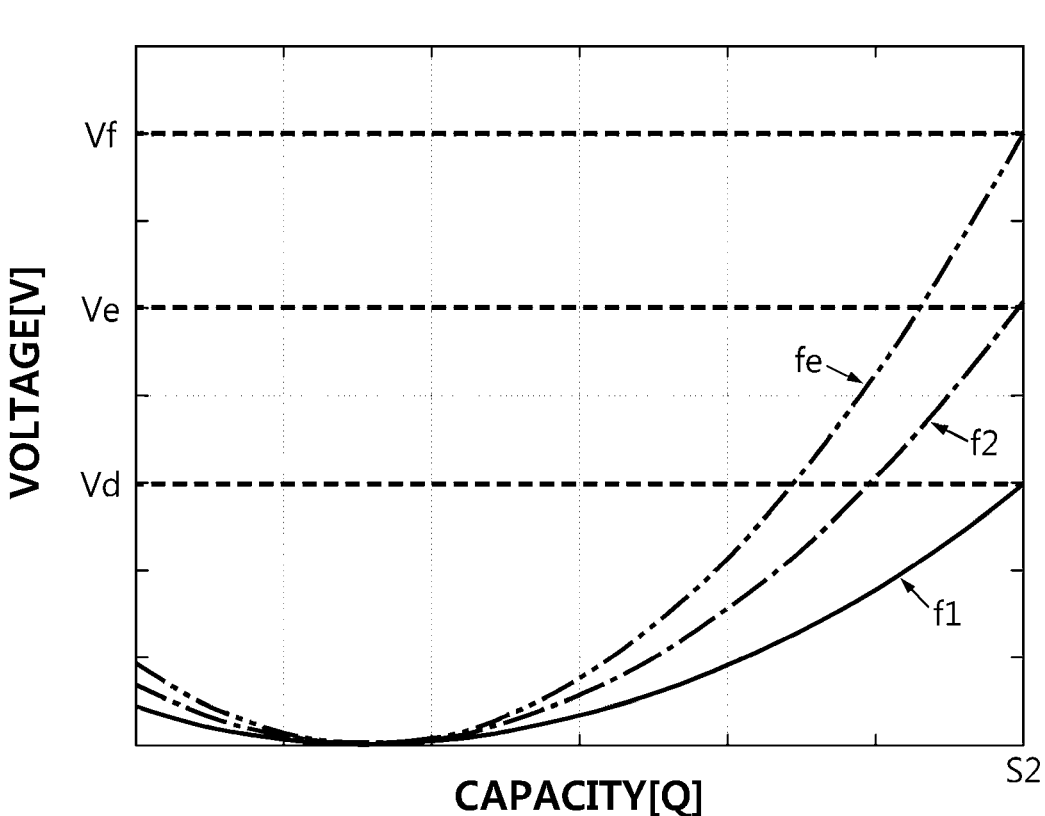
FIG. 9 is a diagram schematically showing a conversion function and a conversion prediction function derived by the battery management apparatus according to an embodiment of the present disclosure.

FIG. 8 is a diagram schematically showing an example where a positive electrode prediction profile (Pc_e) is generated by the battery management apparatus 100 according to an embodiment of the present disclosure. FIG. 9 is a diagram schematically showing a conversion function (f1, f2) and a conversion prediction function (fe) derived by the battery management apparatus 100 according to an embodiment of the present disclosure.

More specifically, FIG. 8 is diagram showing the reference positive electrode profile (Pc), two positive electrode profiles (hereinafter, referred to as the second positive electrode profile (Pc2) and the third positive electrode profile (Pc3)) generated by the profile generating unit 120, and the positive electrode prediction profile (Pc_e) generated by the control unit 130. Here, the second positive electrode profile (Pc2) may be a positive electrode profile generated by the profile generating unit 120 in the embodiment of FIG. 7.

In addition, FIG. 9 is a diagram showing the first conversion function (f1) between the reference positive electrode profile (Pc) and the second positive electrode profile (Pc2), the second conversion function (f2) between the reference positive electrode profile (Pc) and the third positive electrode profile (Pc3), and the conversion prediction function (fe) between the reference positive electrode profile (Pc) and the positive electrode prediction profile (Pc_e). Here, the conversion prediction function (fe) may be derived based on the voltage change amount per capacity between the first conversion function (f1) and the second conversion function (f2).

For example, in the previous embodiment, it is assumed that the positive electrode profile generated by the profile generating unit 120 at the $100^{th}$ cycle point is the second positive electrode profile (Pc2), and the positive electrode profile generated at the $200^{th}$ cycle point is the third positive electrode profile (Pc3). The control unit 130 may derive the first conversion function (f1) capable of converting the reference positive electrode profile (Pc) into the second positive electrode profile (Pc2) by comparing the reference positive electrode profile (Pc) and the second positive electrode profile (Pc2).

In addition, the control unit 130 may derive the second conversion function (f2) capable of converting the reference positive electrode profile (Pc) into the third positive electrode protrode profile (Pc3) by comparing the reference positive electrode profile (Pc) and the third positive electrode profile (Pc3).

That is, the first conversion function (f1) is a conversion function corresponding to the $100^{th}$ cycle point, and the second conversion function (f2) is a conversion function corresponding to the $200^{th}$ cycle point.

In addition, the control unit 130 may derive the conversion prediction function (fe) based on the voltage change rate per capacity between the first conversion function (f1) and the second conversion function (f2) in consideration of a cycle point corresponding to each of the first conversion function (f1) and the second conversion function (f2). Specifically, the conversion prediction function (fe) derived by the control unit 130 may be a conversion function corresponding to the $300^{th}$ cycle point.

In the embodiment of FIG. 9, looking at S2 [mAh] capacity, the voltage corresponding to S2 [mAh] in the first conversion function (f1) is Vd [V], and the voltage corresponding to S2 [mAh] in the second conversion function (f2) is Ve [V]. The control unit 130 may derive the conversion prediction function (fe) in which the voltage corresponding to S2 [mAh] is Vf [V] by considering that the difference between the cycle point corresponding to the first conversion function (f1) and the cycle point corresponding to the second conversion function (f2) is 100 cycle points. In this way, the control unit 130 may derive the conversion prediction function (fe) by comparing the voltage per capacity of the first conversion function (f1) and the voltage per capacity of the second conversion function (f2) in the entire capacity region.

Next, the control unit 130 may be configured to generate the positive electrode prediction profile (Pc_e) by applying the derived conversion prediction function (fe) to the reference positive electrode profile (Pc).

Specifically, the control unit 130 may be configured to generate the positive electrode prediction profile (Pc_e) for the target point by deriving the conversion prediction function (fe) for the target point and applying the derived conversion prediction function (fe) to the reference positive electrode profile (Pc).

For example, in the previous embodiment, the control unit 130 may derive the conversion prediction function (fe) corresponding to the $300^{th}$ cycle point based on the first conversion function (f1) corresponding to the $100^{th}$ cycle point and the second conversion function (f2) corresponding to the $200^{th}$ cycle point. In addition, the control unit 130 may generate the positive electrode prediction profile (Pc_e) corresponding to the $300^{th}$ cycle point by applying the conversion prediction function (fe) to the reference positive electrode profile (Pc).

In an embodiment, the control unit 130 may be configured to generate the battery prediction profile (Pb_e) by calculating a difference between the voltage of the positive electrode prediction profile (Pc_e) and the voltage of the adjusted negative electrode profile for the same capacity.

Figure 10:
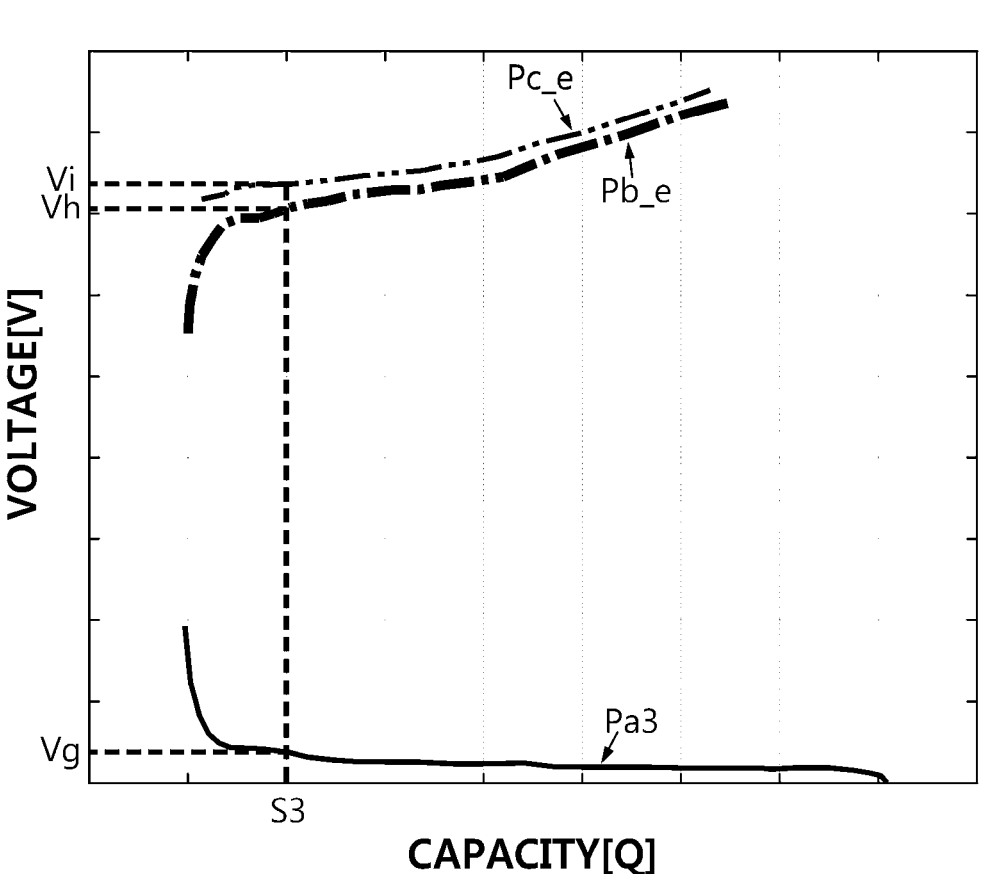
FIG. 10 is a diagram schematically showing an example where a battery prediction profile is generated by the battery management apparatus according to an embodiment of the present disclosure.

FIG. 10 is a diagram schematically showing an example where the battery prediction profile (Pb_e) is generated by the battery management apparatus 100 according to an embodiment of the present disclosure.

Referring to FIGS. 8 and 10, the adjusted negative electrode profile (Pa3) of FIG. 10 may be a negative electrode profile corresponding to the third positive electrode profile (Pc3). That is, the adjusted negative electrode profile (Pa3) of FIG. 10 is a negative electrode profile generated by adjusting the offset and/or the scale of the reference negative electrode profile (Pa) in order for the profile generating unit 120 to generate the third positive electrode profile (Pc3).

For example, in the embodiment of FIG. 10, looking at S3 [mAh] capacity, the voltage corresponding to the S3 [mAh] capacity in the adjusted negative electrode profile (Pa3) may be Vg [V], and the voltage corresponding to the S3 [mAh] capacity in the positive electrode prediction profile (Pc_e) may be Vi [V]. The control unit 130 may obtain Vh [V] by calculating "Vi–Vg". In addition, the control unit 130 may generate a battery prediction profile (Pb_e) in which the voltage corresponding to the S3 [mAh] capacity is Vh [V].

As described above, the negative electrode profile may change while maintaining the overall shape even if the battery cell B is degraded, and the degree of change may not be large. Therefore, the control unit 130 may generate the battery prediction profile (Pb_e) corresponding to the $300^{th}$ cycle point based on the positive electrode prediction profile (Pc_e) corresponding to the $300^{th}$ cycle point and the adjusted negative electrode profile (Pa3) corresponding to the $200^{th}$ cycle point.

In the above, the embodiment in which the profile generating unit 120 generates a battery profile and a positive electrode profile at the $100^{th}$ cycle point and the $200^{th}$ cycle point has been described. However, in order to improve the accuracy of the battery prediction profile (Pb_e) generated by the control unit 130, the cycle in which the profile generating unit 120 generates the battery profile and the positive electrode profile may be adjusted. For example, the profile generating unit 120 may generate a battery profile and a positive electrode profile at every 10 cycle points.

In another embodiment, the control unit 130 may be configured to generate the battery prediction profile (Pb_e) by calculating the difference between the voltage of the positive electrode prediction profile (Pc_e) and the voltage of the reference negative electrode profile (Pa) for the same capacity.

For example, unlike the embodiment of FIG. 10, the control unit 130 may generate the battery prediction profile (Pb_e) based on the positive electrode prediction profile (Pc_e) and the reference negative electrode profile (Pa). That is, as described above, even if the battery cell B is degraded, the shape of the reference negative electrode profile (Pa) does not change significantly, so the control unit 130 may also generate the battery prediction profile (Pb_e), which further considers the degradation associated with the positive electrode of the battery cell B, based on the reference negative electrode profile (Pa).

On the other hand, the profile generating unit 120 may be configured to generate the battery profile (Pb) and generate the positive electrode profile at every preset cycle.

For example, the profile generating unit 120 may generate a battery profile (Pb) and a positive electrode profile at every 100 cycle points. In the embodiment of FIG. 8, the second positive electrode profile (Pc2) may be a positive electrode profile generated at the $100^{th}$ cycle point, and the third positive electrode profile (Pc3) may be a positive electrode profile generated at the $200^{th}$ cycle point.

In addition, the control unit 130 may be configured to derive a conversion function between each of the plurality of positive electrode profiles (Pc2, Pc3) generated by the profile generating unit 120 until the current cycle and the reference positive electrode profile (Pc) and derive the conversion prediction function (fe) based on the plurality of derived conversion functions (f1, f2).

That is, when the positive electrode profile is generated by the profile generating unit 120, the control unit 130 may derive a conversion function for the corresponding cycle point. For example, in the embodiment of FIG. 9, the control unit 130 may derive the first conversion function (f1)

corresponding to the second positive electrode profile (Pc2) generated at the $100^{th}$ cycle point. In addition, the control unit 130 may derive the second conversion function (f2) corresponding to the third positive electrode profile (Pc3) generated at the $200^{th}$ cycle point.

In addition, the control unit 130 may be configured to generate the battery prediction profile (Pb_e) after generating the positive electrode prediction profile (Pc_e) using the derived conversion prediction function (fe) and the reference positive electrode profile (Pc) until the next cycle arrives.

For example, assuming that the next cycle is the $300^{th}$ cycle point, the control unit 130 may generate a plurality of battery prediction profiles (Pb_e) by deriving the conversion prediction functions (fe) from the $201^{st}$ cycle point to the $299^{th}$ cycle point.

That is, the control unit 130 may generate the battery prediction profile (Pb_e) not only at the cycle point where the battery profile (Pb) and the positive electrode profile (Pc2, Pc3) are generated by the profile generating unit 120 but also at the time point until the next cycle arrives. Therefore, since the battery profile (Pb) or the battery prediction profile (Pb_e) at various cycle points may be obtained, the battery management apparatus 100 according to an embodiment of the present disclosure has an advantage of providing a profile by which the degradation of the battery cell B may be more specifically analyzed.

In addition, according to an embodiment of the present disclosure, the battery profile (Pb), the positive electrode profile (Pc2, Pc3), and the adjusted negative electrode profile (Pa2, Pa3) corresponding to each other may be provided, or the battery prediction profile (Pb_e), the positive electrode prediction profile (Pc_e), and the adjusted negative electrode profile (Pa2, Pa3) corresponding to each other may be provided. That is, not only the profile (the battery profile (Pb) or the battery prediction profile (Pb_e)) for a full cell is provided as data for analyzing the degradation of the battery cell B, but also the profile (the positive electrode profile (Pc2, Pc3)) for the positive electrode half-cell or the profile (the adjusted negative electrode profile (Pa2, Pa3)) for the positive electrode prediction profile (Pc_e)) and the negative electrode half-cell profile may be provided together. Accordingly, it is possible to more precisely analyze not only whether the battery cell B is degraded, but also analyze the cause of degradation whether the degradation of the battery cell B is due to the degradation of the positive electrode or the degradation of the negative electrode.

The battery management apparatus 100 according to the present disclosure may be applied to a BMS (Battery Management System). That is, the BMS according to the present disclosure may include the battery management apparatus 100. In this configuration, at least some of the components of the battery management apparatus 100 may be implemented by supplementing or adding functions of components included in a conventional BMS. For example, the measuring unit 110, the profile generating unit 120, the control unit 130 and the storage unit 140 of the battery management apparatus 100 may be implemented as components of the BMS.

In addition, the battery management apparatus 100 may be provided to a battery pack 1. That is, the battery pack 1 according to the present disclosure may include the battery management apparatus 100 as described above and at least one battery cell B. In addition, the battery pack 1 may further include electrical equipment (relays, fuses, etc.), a case, and the like.

For example, in the embodiment of FIG. 2, the battery pack 1 may include a battery cell B and the battery management apparatus 100. In addition, a charging and discharging unit 2 may be connected to a positive electrode terminal (P+) and a negative electrode terminal (P−) of the battery pack 1 to charge or discharge the battery cell B. As another example, in the embodiment of FIG. 2, all of the battery cell B, the battery management apparatus 100, and the charging and discharging unit 2 may be included in the battery pack 1.

Figure 11:
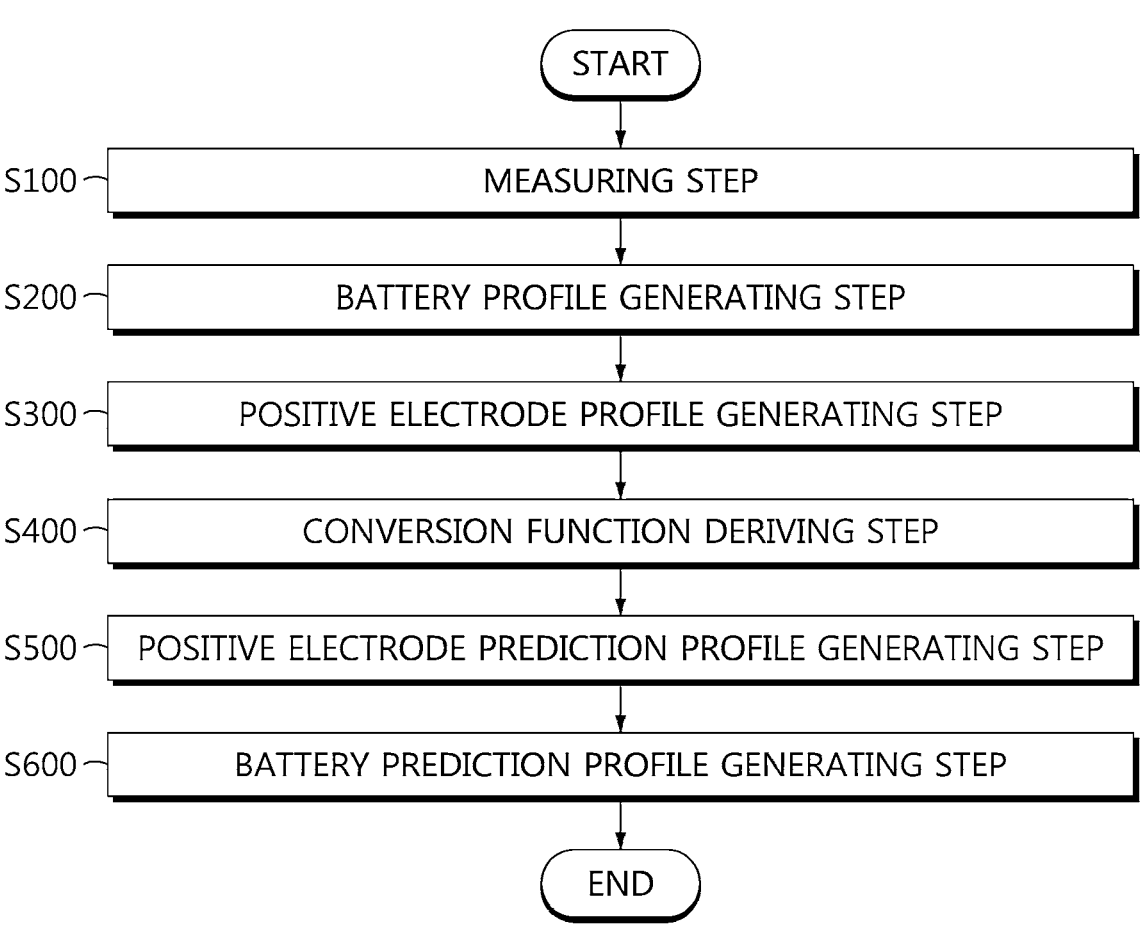
FIG. 11 is a diagram schematically showing a battery management method according to another embodiment of the present disclosure.

FIG. 11 is a diagram schematically showing a battery management method according to another embodiment of the present disclosure.

Each step of the battery management method according to another embodiment of the present disclosure may be performed by the battery management apparatus 100. Hereinafter, for convenience of description, it should be noted that the content overlapping with the previously described content will be omitted or briefly described.

Referring to FIG. 11, the battery management method may include a measuring step (S100), a battery profile generating step (S200), a positive electrode profile generating step (S300), a conversion function deriving step (S400), a positive electrode prediction profile generating step (S500), and a battery prediction profile generating step (S600).

The measuring step (S100) is a step of measuring the voltage and capacity of the battery cell B, and may be performed by the measuring unit 110.

For example, in the embodiment of FIG. 2, the measuring unit 110 may measure the voltage of the battery cell B using the first sensing line SL1 and the second sensing line SL2. Also, the measuring unit 110 may measure the current of the battery cell B using the third sensing line SL3, and may measure the capacity of the battery cell B based on the measurement time and the measured current.

The battery profile generating step (S200) is a step of generating a battery profile (Pb) representing the correspondence between the voltage and the capacity measured in the measuring step (S100), and may be performed by the profile generating unit 120.

For example, in the embodiment of FIG. 3, the profile generating unit 120 may receive the voltage and the capacity of the battery cell B from the measuring unit 110, and generate a battery profile (Pb) representing the correspondence between the voltage and the capacity corresponding to each other.

The positive electrode profile generating step (S300) is a step of generating a positive electrode profile of the battery cell B based on the battery profile (Pb) generated in the battery profile generating step (S200) as well as a reference negative electrode profile (Pa) and a reference negative electrode differential profile (Pa_d) preset for the battery cell B, and may be performed by the profile generating unit 120.

Specifically, the profile generating unit 120 may convert the battery profile (Pb) into a battery differential profile (Pb_d). In addition, the profile generating unit 120 may adjust the reference negative electrode differential profile (Pa_d) to correspond to the battery differential profile (Pb_d). In addition, the profile generating unit 120 may adjust the reference negative electrode profile (Pa) to correspond to the adjusted negative electrode differential profile (Pa_d2). Finally, the profile generating unit 120 may generate a positive electrode profile based on the adjusted negative electrode profile (Pa2) and the battery profile (Pb).

For example, in the embodiment of FIG. 7, the profile generating unit 120 may generate a positive electrode profile by summing the voltage per capacity of the generated battery profile (Pb) and the voltage per capacity of the adjusted negative electrode profile (Pa2).

The conversion function deriving step (S400) is a step of deriving a conversion function representing conversion information from the reference positive electrode profile (Pc) preset for the battery cell B to the generated positive electrode profile, and may be performed by the control unit 130.

That is, when the conversion function is applied to the reference positive electrode profile (Pc), the positive electrode profile generated by the profile generating unit 120 may be derived. In other words, if the conversion function is applied inversely to the positive electrode profile, the reference positive electrode profile (Pc) may be derived.

The positive electrode prediction profile generating step (S500) is a step of generating a positive electrode prediction profile (Pc_e) for the battery cell B from the reference positive electrode profile (Pc) based on the conversion function derived in the conversion function deriving step (S400), and may be performed by the control unit 130.

Specifically, the control unit 130 may include a plurality of conversion functions, and may derive a conversion prediction function (fe) based on the voltage change per capacity of the plurality of provided conversion functions. In addition, the control unit 130 may generate the positive electrode prediction profile (Pc_e) by applying the derived conversion prediction function (fe) to the reference positive electrode profile (Pc).

The battery prediction profile generating step (S600) is a step of generating a battery prediction profile (Pb_e) for the battery cell B based on the positive electrode prediction profile (Pc_e) generated in the positive electrode prediction profile generating step (S500), and may be performed by the control unit 130.

For example, in the embodiment of FIG. 10, the control unit 130 may generate a battery prediction profile (Pb_e) based on the positive electrode prediction profile (Pc_e) and the adjusted negative electrode profile (Pa2). As another example, the control unit 130 may generate a battery prediction profile (Pb_e) based on the positive electrode prediction profile (Pc_e) and the reference negative electrode profile (Pa). However, preferably, the battery prediction profile (Pb_e) may be generated based on the positive electrode prediction profile (Pc_e) and the adjusted negative electrode profile (Pa2).

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
2: charging and discharging unit
100: battery management apparatus
110: measuring unit
120: profile generating unit
130: control unit
140: storage unit
B: battery cell

What is claimed is:

1. A battery management apparatus, comprising:
a measuring circuit configured to measure voltage and capacity of a battery cell;
a profile generator configured to generate a battery profile representing a correspondence between the voltage and the capacity measured by the measuring circuit, to generate a positive electrode profile of the battery cell based on the generated battery profile, and to generate a reference negative electrode profile and a reference negative electrode differential profile preset for the battery cell; and
a controller configured to receive the generated positive electrode profile from the profile generator, to derive a conversion function representing conversion information from a reference positive electrode profile preset for the battery cell to the generated positive electrode profile, to generate a positive electrode prediction profile for the battery cell from the reference positive electrode profile based on the derived conversion function, and to generate a battery prediction profile for the battery cell based on the generated positive electrode prediction profile.

2. The battery management apparatus according to claim 1,
wherein the profile generator is further configured to convert the battery profile into a battery differential profile representing a correspondence between the capacity and a differential voltage for the capacity, to adjust the reference negative electrode differential profile preset for the battery cell to correspond to the battery differential profile, to adjust the reference negative electrode profile to correspond to the adjusted negative electrode differential profile, and to generate the positive electrode profile based on the adjusted negative electrode profile and the battery profile.

3. The battery management apparatus according to claim 2,
wherein the profile generator is further configured to determine a plurality of reference peaks in the battery differential profile and to adjust the reference negative electrode differential profile preset for the battery cell such that a capacity of a plurality of target peaks preset in the reference negative electrode differential profile preset for the battery cell becomes identical to a capacity of a corresponding reference peak.

4. The battery management apparatus according to claim 3,
wherein the profile generator is further configured to adjust the reference negative electrode differential profile preset for the battery cell by adjusting an offset corresponding to a minimum capacity of the reference negative electrode differential profile preset for the battery cell and a scale representing an entire capacity region of the reference negative electrode differential profile preset for the battery cell.

5. The battery management apparatus according to claim 4,
wherein the profile generator is further configured to adjust the reference negative electrode profile to correspond to the adjusted negative electrode differential profile by applying change information of the offset and the scale for the adjusted negative electrode differential profile to the reference negative electrode profile.

6. The battery management apparatus according to claim 2,
wherein the controller is further configured to generate the battery prediction profile by calculating a difference between a voltage of the positive electrode prediction profile and a voltage of the adjusted negative electrode profile for the same capacity.

7. The battery management apparatus according to claim 1,
wherein the controller is further configured to generate the battery prediction profile by calculating a difference between a voltage of the positive electrode prediction profile and a voltage of the reference negative electrode profile for the same capacity.

8. The battery management apparatus according to claim 1,
wherein the conversion function is configured to convert a voltage per capacity of the reference positive electrode profile into a voltage per capacity of the generated positive electrode profile, for the same capacity.

9. The battery management apparatus according to claim 1,
wherein, if the conversion function is provided in plurality, the controller is further configured to derive a conversion prediction function based on a voltage change amount per capacity between the plurality of conversion functions and generate the positive electrode prediction profile by applying the derived conversion prediction function to the reference positive electrode profile.

10. The battery management apparatus according to claim 9,
wherein the controller is further configured to derive the conversion prediction function for a target point and to generate the positive electrode prediction profile for the target point by applying the derived conversion prediction function to the reference positive electrode profile.

11. The battery management apparatus according to claim 9,
wherein the profile generator is further configured to generate the battery profile and generate the positive electrode profile at every preset cycle, and
wherein the controller is further configured to derive a conversion function between each of a plurality of positive electrode profiles generated by the profile generator until a current cycle and the reference positive electrode profile, to derive the conversion prediction function based on the plurality of derived conversion functions, to generate the positive electrode prediction profile by using the derived conversion prediction function and the reference positive electrode profile until a next cycle arrives, and then to generate the battery prediction profile.

12. A battery pack, comprising the battery management apparatus according to claim 1.

13. A battery management method, comprising:

measuring voltage and capacity of a battery cell;

generating a battery profile representing a correspondence between the measured voltage and the measured capacity of the battery cell;

generating a positive electrode profile of the battery cell based on the generated battery profile and generating a reference negative electrode profile and a reference negative electrode differential profile preset for the battery cell;

deriving a conversion function representing conversion information from a reference positive electrode profile preset for the battery cell to the generated positive electrode profile;

generating a positive electrode prediction profile for the battery cell from the reference positive electrode profile based on the derived conversion function; and generating a battery prediction profile for the battery cell based on the generated positive electrode prediction profile.

* * * * *